United States Patent
Yu

(10) Patent No.: US 6,551,886 B1
(45) Date of Patent: Apr. 22, 2003

(54) ULTRA-THIN BODY SOI MOSFET AND GATE-LAST FABRICATION METHOD

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/844,637

(22) Filed: Apr. 27, 2001

(51) Int. Cl.[7] ............................................. H01L 21/336
(52) U.S. Cl. ...................... 438/300; 438/149; 438/183; 438/311; 438/479; 438/517
(58) Field of Search ..................... 438/479, 183, 438/311, 517, 149, 197, 664, 300; 257/347

(56) References Cited

U.S. PATENT DOCUMENTS

| | | | | |
|---|---|---|---|---|
| 5,668,046 A | * | 9/1997 | Koh et al. ................. | 438/481 |
| 6,051,473 A | * | 4/2000 | Ishida et al. ............... | 438/300 |
| 6,087,208 A | * | 7/2000 | Krivokapic et al. ......... | 438/183 |
| 6,133,106 A | * | 10/2000 | Evans et al. ............... | 438/299 |
| 6,200,866 B1 | * | 3/2001 | Ma et al. .................. | 438/299 |
| 6,323,112 B1 | * | 11/2001 | Lou ......................... | 438/514 |
| 6,403,433 B1 | * | 6/2002 | Yu et al. ................... | 438/300 |
| 2002/0072181 A1 | * | 6/2002 | Tseng ....................... | 438/300 |

* cited by examiner

Primary Examiner—Amir Zarabian
Assistant Examiner—Jeff Vockrodt
(74) Attorney, Agent, or Firm—LaRiviere, Grubman & Payne, LLP

(57) ABSTRACT

An ultra-thin body SOI MOSFET transistor and fabrication method are described which provide extended silicide depth in a gate-last process. The method utilizes the fabrication of a dummy gate, comprising insulation, which is replaced with an insulated gate after implantation, annealing, and the formation of silicide so that diffusion effects are reduced. By way of example, dummy gate stacks are created having insulating upper segments. Silicon is deposited on the wafer and planarized to expose the insulating segment. The junction is formed by implantation followed by annealing to recrystallize the silicon and to activate the junction. Silicide is then formed, to a depth which can exceed the thickness of the silicon within the SOI wafer, on the upper portion of the silicon layer. The segment of insulation is then removed and a gate is formed with a gate electrode insulated by high-k dielectric.

16 Claims, 7 Drawing Sheets

Field of the Invention

ULTRA-THIN BODY SOI MOSFET AND GATE-LAST FABRICATION METHOD

BACKGROUND OF THE INVENTION

1. Field of the Invention

The present invention relates to MOSFET device fabrication and more particularly to an ultra-thin body SOI MOSFET transistor and a fabrication method which allows for extending silicide depth in a gate-last process.

2. Description of the Background Art

The continued drive toward increasing integrated circuit densities has required continued reductions in channel size. As channels narrow, the short-channel effects within MOSFET devices become increasingly pronounced. The semiconductor industry, therefore, has sought solutions to alleviate, or bypass, these short-channel effects. Ultra-thin body, fully-depleted (FD) SOI MOSFET transistors are a suitable candidate for large-scale integration, as physical gate lengths below thirty five nanometers (<35 nm) may be supported while retaining excellent short-channel performance. Short-channel effects include such adverse effects as threshold voltage roll-off and drain-induced barrier lowering. Ultra-thin body FD MOSFET devices provide additional benefits by way of reduced subthreshold slope and the elimination of parasitic junction capacitance. The use of fully-depleted SOI devices, however, is complicated by process difficulties that arise in forming silicide on the very thin source-drain junctions within an SOI device. As a result of these difficulties, the use of elevated source and drain contact areas is highly desirable.

Furthermore, as critical dimensions of transistors continue shrinking, the thickness of gate oxide is reduced such that direct tunneling leakage current through the very thin gate oxide, of typically less than twenty five Angstroms (<25 Å), increases dramatically. To suppress the severe gate leakage currents, a material with a high dielectric constant (high-k) can be preferably utilized to replace the conventional thermal oxide of the gate dielectric. To provide a high-k dielectric gate insulator with substantially the same effective thickness as oxide, the required physical thickness of high-k material increases. It will be appreciated that the direct current density is exponentially proportional to the physical dielectric thickness. Therefore, direct tunneling current flow through the gate insulator is significantly reduced. This is a primary motivation for utilizing high-k material as a gate insulator for very small transistors. Typically, high-k material may be selected from a metal oxide such as $TiO_2$, $Ta_2O_5$, and so forth. A drawback to the use of high-k material, however, is with thermal stability, as metal atoms diffuse from the high-k material into the silicon when exposed to high temperatures above approximately seven hundred degrees Celsius (>700° C.). Metallic diffusion poses a challenge in the fabrication process because the $CoSi_2$ anneal temperature is performed in the range of from approximately eight hundred degrees Celsius and eight hundred twenty five degrees Celsius (800° C.–825° C.).

Therefore, a need exists for an ultra-thin body SOI MOSFET transistor having an elevated source and drain which is fabricated without the necessity of exposing the metal gate regions to high temperatures. The present invention satisfies those needs, as well as others, and overcomes deficiencies in previously developed solutions.

BRIEF SUMMARY OF THE INVENTION

The present invention describes an ultra-thin body SOI MOSFET transistor and a gate-last fabrication method which provides elevated source-drain structures that support a thick silicide layer. The gate-last process facilitates utilizing thin high-k dielectric layers without the attendant diffusion effects associated with exposing a gate insulated with high-k material to high temperatures. Within the gate-last process, the gate insulator is formed for the device after polishing, recrystallization, and silicide formation. The method is practiced by retaining an insulating segment as a dummy gate "place-holder" for the gate during the high-temperature processing steps, concluding with silicide formation. The segment of insulation comprising the dummy gate is then replaced with a physical gate comprising the desired high-k dielectric material and a gate electrode.

Specifically, the gate-last process of the present invention may be performed by way of example in the following steps. Patterning of an SOI wafer with an insulation layer to form silicon-insulator stacks. An amorphous silicon (a-Si) material is deposited to cover the silicon-insulator stacks and this is planarized to expose the insulator segment, and recrystallized. The junction is created beneath the insulator segment by performing the desired implantations. Annealing of the wafer is performed to recrystallize the silicon and activate the source-drain junction. Silicide is then formed in the surface of the recrystallized silicon to the desired depth. The insulator segment is removed to form a cavity which is then filled with a high-k dielectric material within which a metallic gate electrode is formed. The remainder of the MOSFET transistor may be fabricated according to conventional fabrication practices. An object of the invention is to fabricate an ultra-thin body SOI MOSFET transistor utilizing high-k dielectric and source-drain regions which are capable of supporting thick silicide formation.

Another object of the invention is to fabricate the ultra-thin body MOSFET transistor utilizing a high-k dielectric within the gate, while not exposing the dielectric to high temperatures during fabrication.

Another object of the invention is to fabricate the ultra-thin body MOSFET transistor utilizing conventional semiconductor materials and processing equipment.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Referring more specifically to the drawings, for illustrative purposes the present invention is embodied in the apparatus generally shown in FIG. 1 through FIG. 7. It will be appreciated that the apparatus may vary as to configuration and as to details of the parts, and that the method may vary as to the specific steps and sequence, without departing from the basic concepts as disclosed herein.

Figure 1:
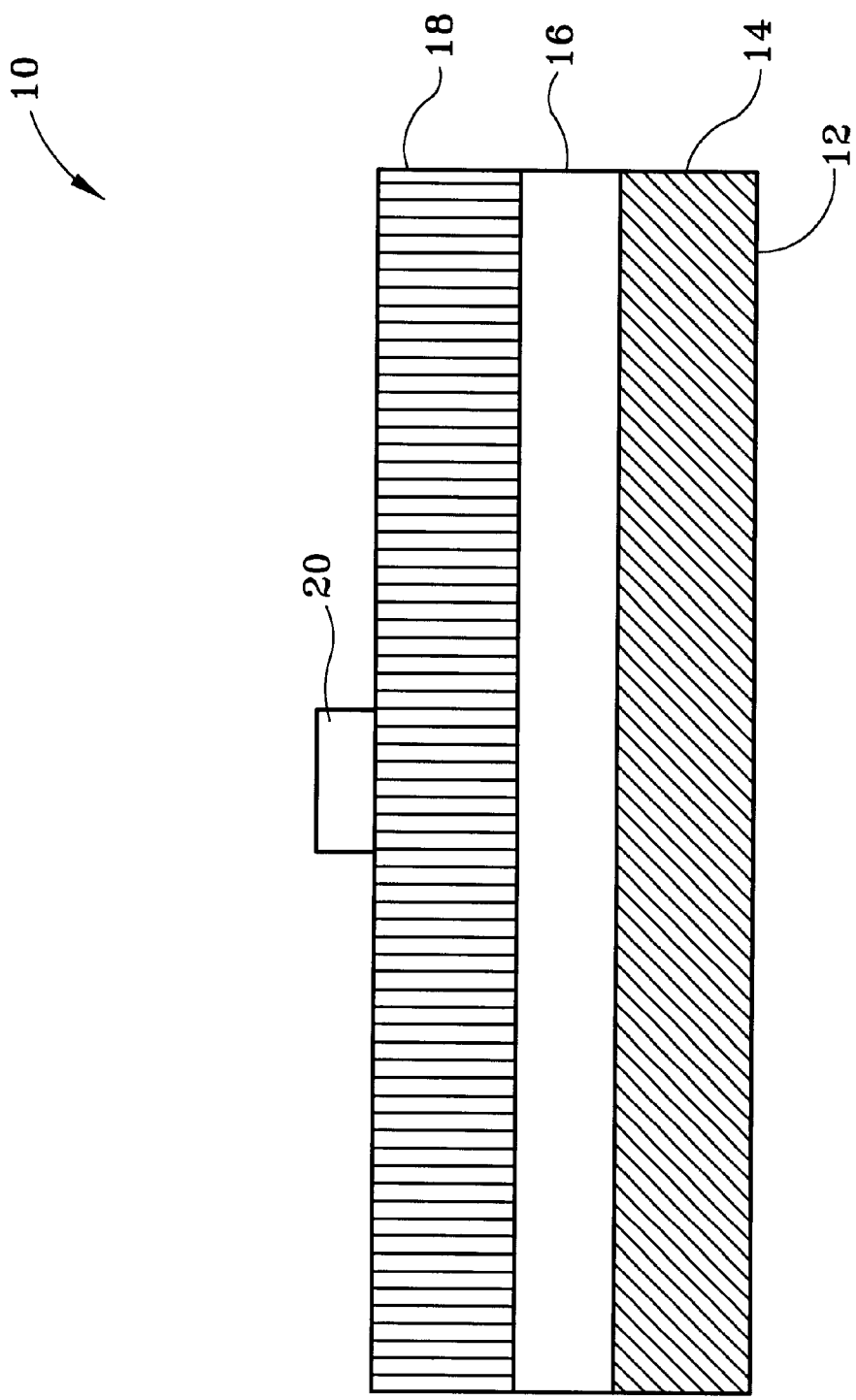
FIG. 1 is a schematic view of a MOSFET transistor being formed on an SOI substrate according to an aspect of the present invention, showing placement of a mask pattern over a deposited insulation layer.
Figure 2:
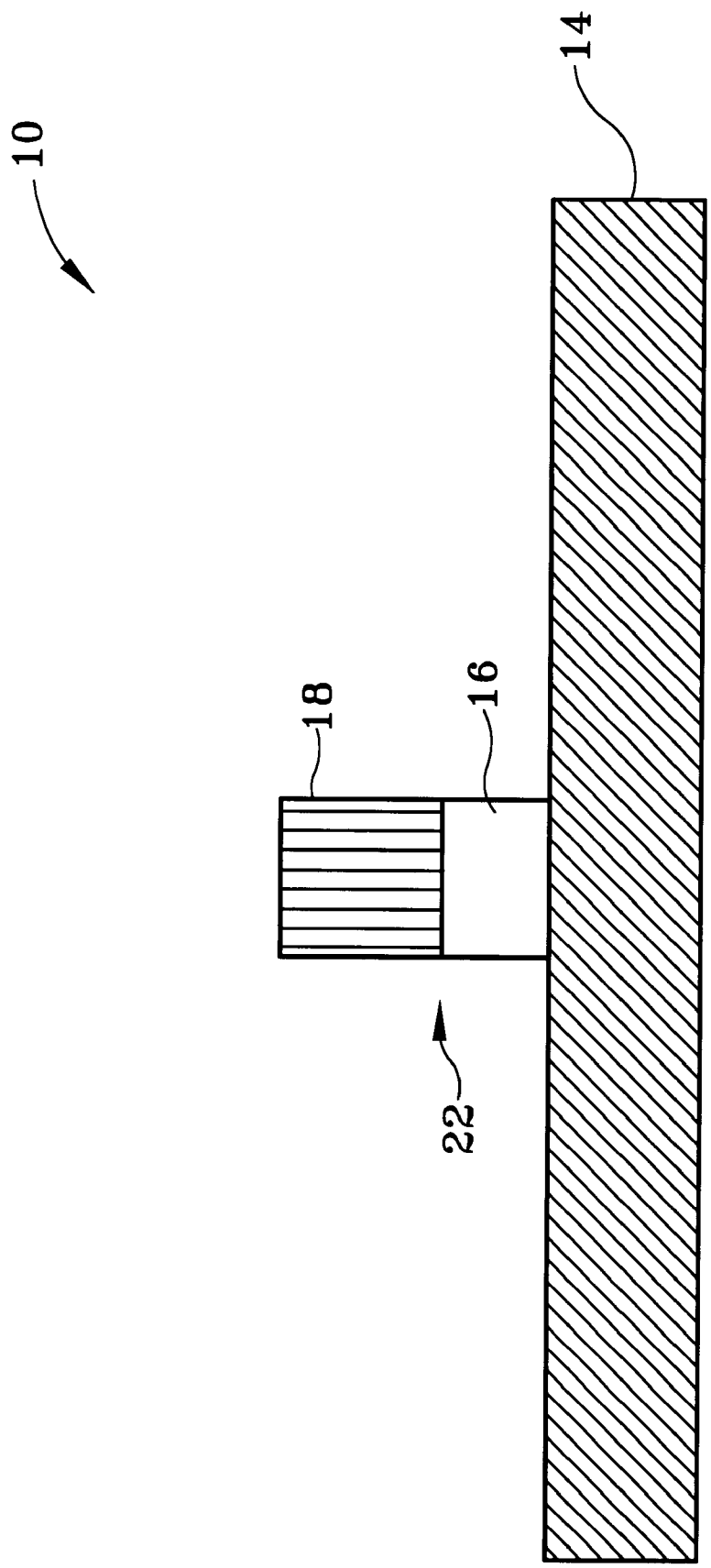
FIG. 2 is a schematic view of the MOSFET transistor of FIG. 1, shown subsequent to formation of a dummy gate stack comprising an insulation segment over a silicon segment within a silicon-insulator stack.
Figure 3:
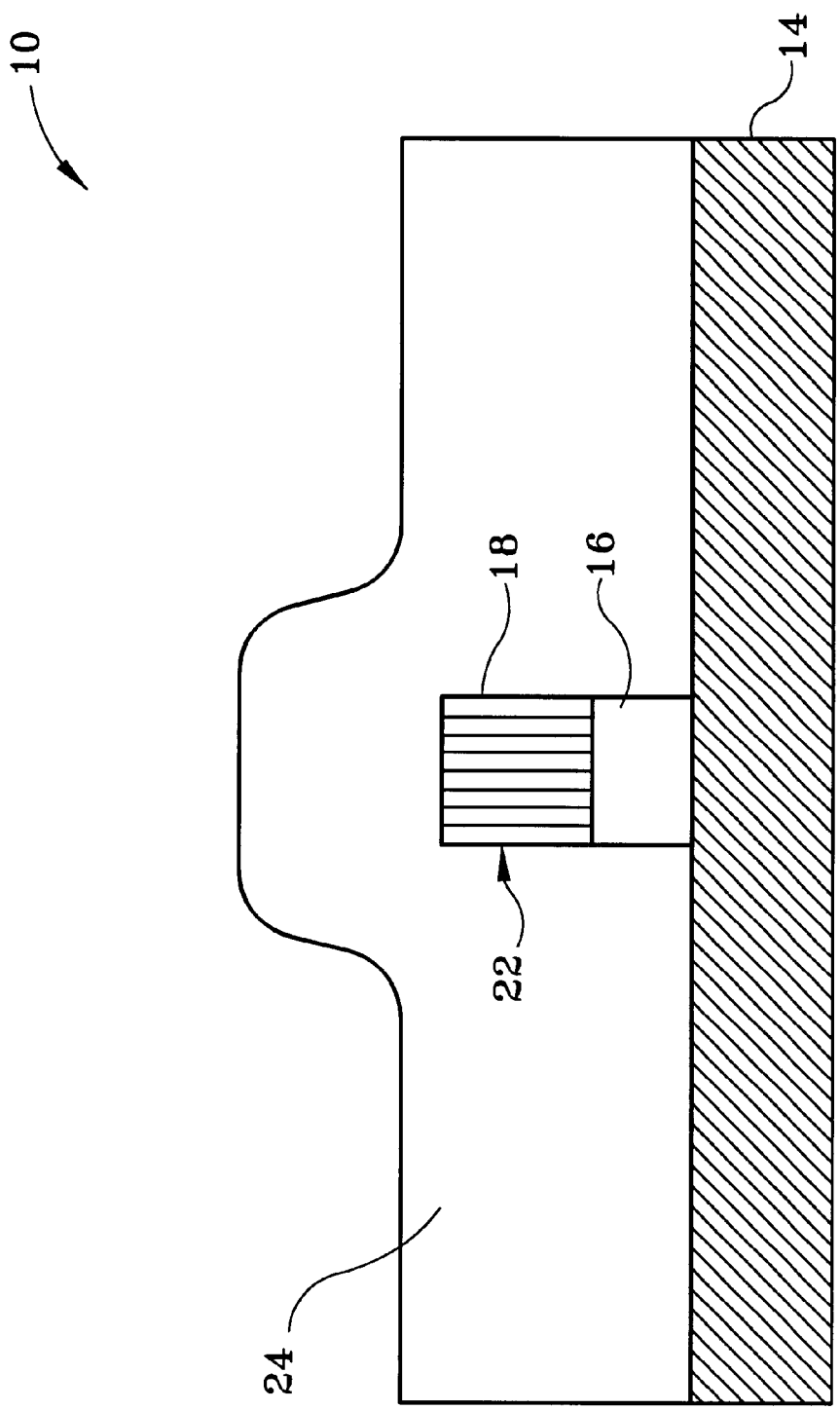
FIG. 3 is a schematic view of the MOSFET transistor of FIG. 2, shown after depositing a thick amorphous silicon (a-Si) layer.
Figure 4:
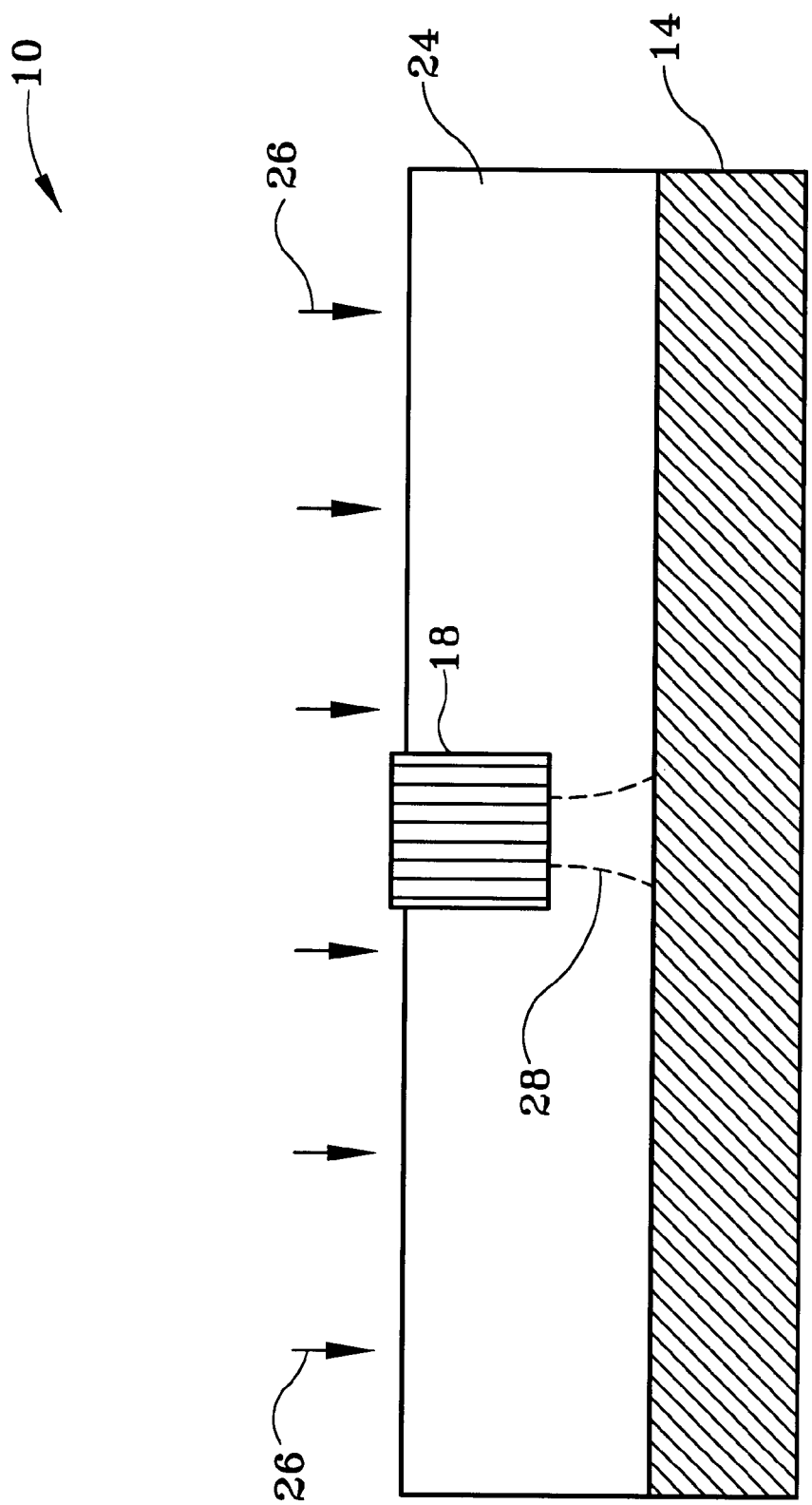
FIG. 4 is a schematic view of the MOSFET transistor of FIG. 3, shown subsequent to planarization and recrystallization of the silicon layer and the implantation of a source-drain junction under the insulator segment.
Figure 5:
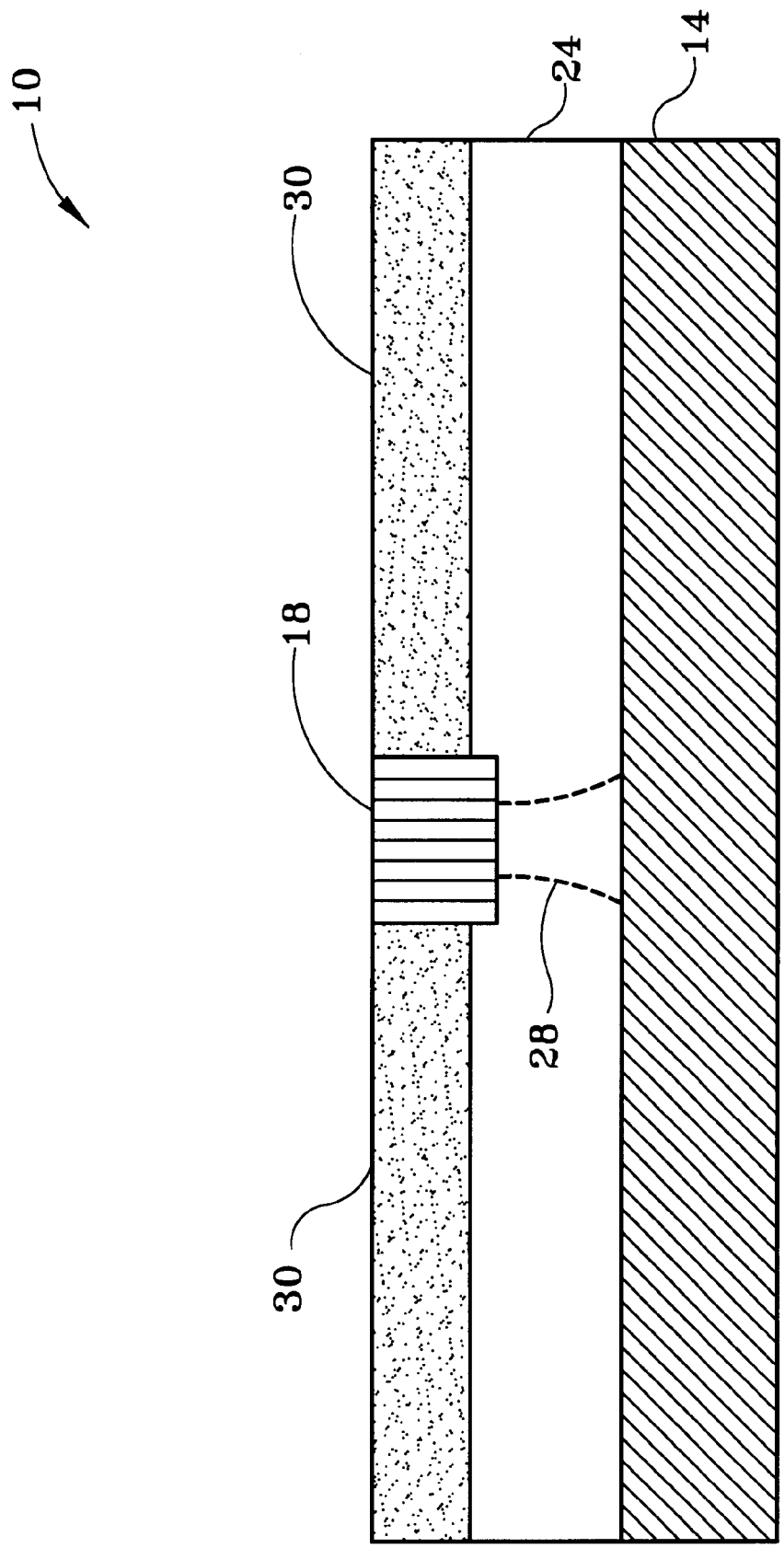
FIG. 5 is a schematic view of the MOSFET transistor of FIG. 4, shown after silicide formation within the upper layer of recrystallized silicon.
Figure 6:
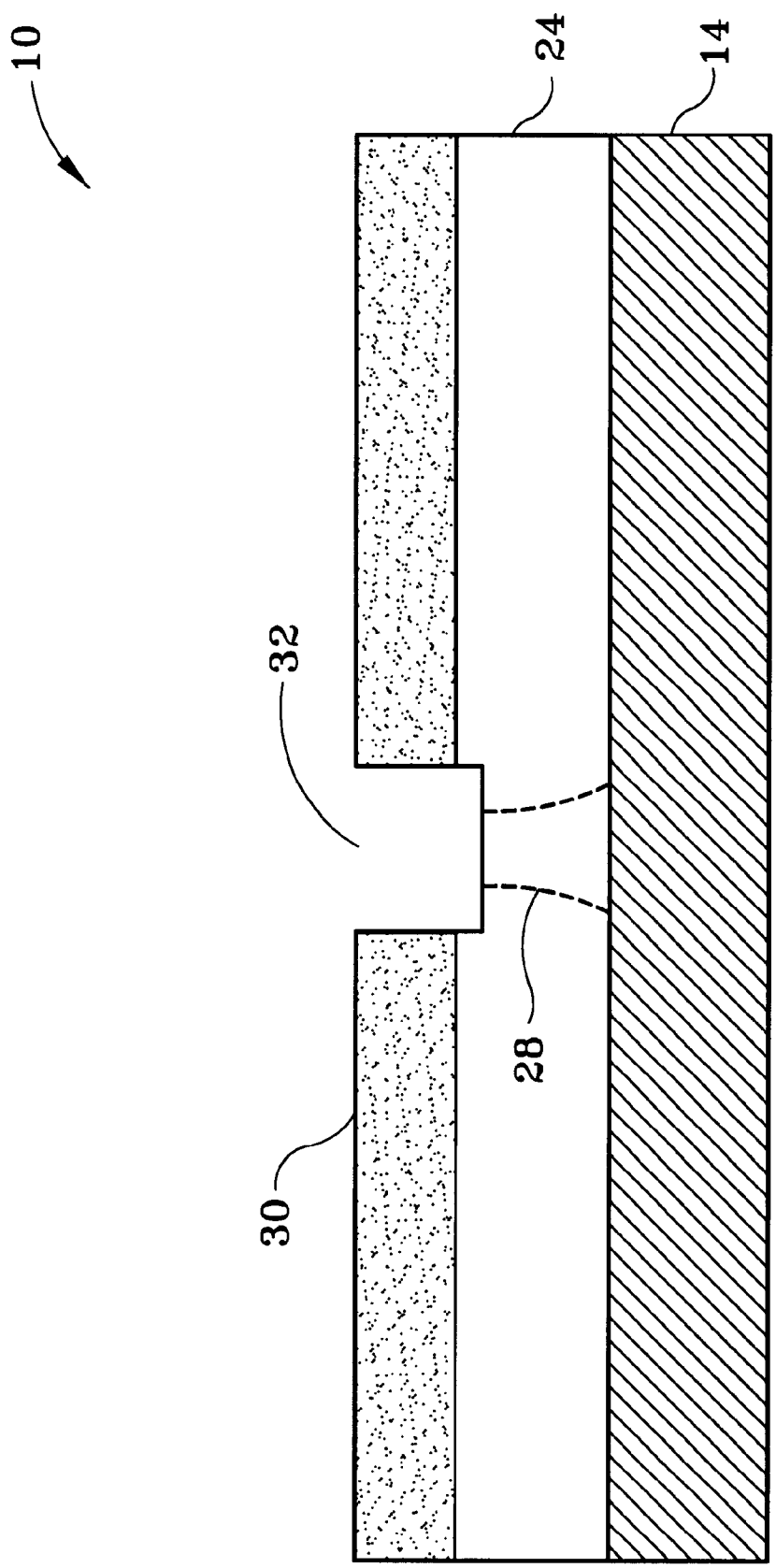
FIG. 6 is a schematic view of the MOSFET transistor of FIG. 5, shown upon removal of the dummy gate to create a gate cavity.
Figure 7:
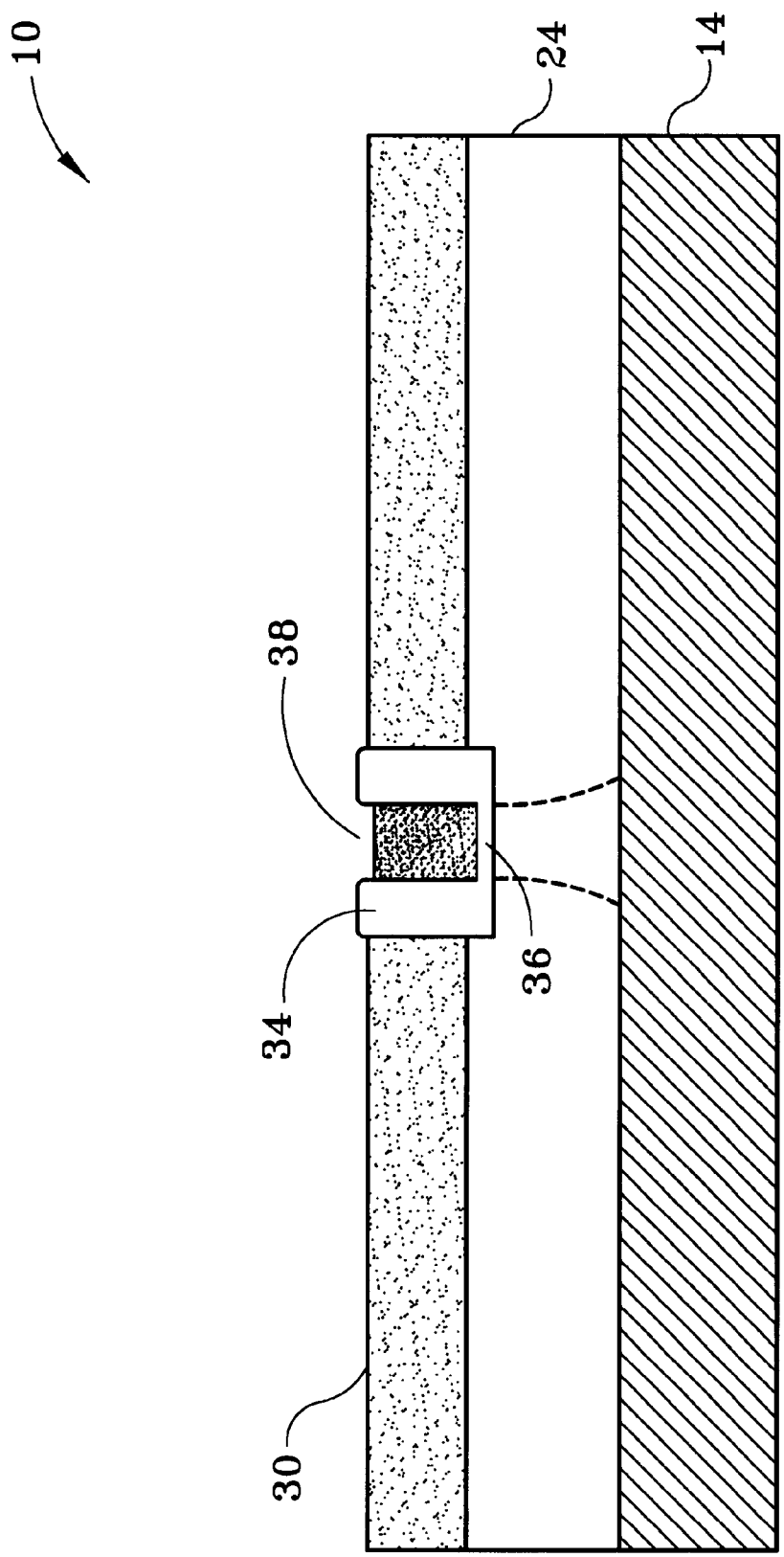
FIG. 7 is a schematic view of the MOSFET transistor of FIG. 6, shown after formation of a high-k dielectric and gate electrode within the gate cavity.

FIG. 1 shows a MOSFET device 10 being fabricated on a substrate 12 comprising a portion of an SOI (silicon-on-insulator) wafer. The gate length of the device is preferably less than approximately thirty five nanometers (<35 nm). The SOI of the substrate preferably comprises silicon dioxide ($SiO_2$) as an insulating lower layer 14, and a silicon (Si) upper layer 16. An insulating layer (dummy layer) 18 is deposited over the silicon layer 16 of SOI substrate 12. Preferably the insulating layer 18 comprises deposited silicon nitride ($Si_3N_4$). A photoresist 20 has been applied to control subsequent etching of the combined insulator and silicon layers. Insulating layer 18 and silicon layer 16 are etched to form a silicon-insulator stack 22 as shown in FIG. 2 having a segment of insulation layer 18 above a segment of silicon layer 16. The silicon-insulator stack 22 is preferably configured to a height of from approximately eight hundred Angstroms to fifteen hundred Angstroms (800 Å–1500 Å). A thick undoped amorphous silicon layer from 3000–6000 (a-Si) 24 is applied over the silicon-insulator stack 22 as shown in FIG. 3. Amorphous silicon layer 24 is planarized to expose the segment of insulation layer 18 as shown in FIG. 4. Planarization is preferably performed by a chemical-mechanical polishing process wherein the silicon nitride ($Si_3N_4$) segment acts as the polishing stopper. A source-drain implantation 26 is performed within silicon layer 24 to implant a junction 28 beneath the segment of insulation layer 18. The silicon layer 24 is then recrystallized, such as by a low-temperature furnace anneal process performed in a temperature range of from approximately five hundred degrees Celsius to six hundred degree Celsius (500° C.–600° C.). The recrystallization process also activates the dopant of the source-drain junction 28 beneath the segment of insulation layer 18. In FIG. 5 a silicide layer 30 has been formed within the upper portion of the recrystallized silicon layer 24. It will be appreciated that the silicide layer may be formed to a depth which is determined by the depth of the deposited silicon layer subsequent to planarization and is not restrained by the thickness of the silicon layer within the SOI wafer 12. The segment of insulation layer 18 (dummy insulation) is removed from the silicon layer 24 to form gate cavity 32 as shown in FIG. 6. Gate cavity 32 is lined with dielectric as illustrated in FIG. 7 with a sidewall dielectric spacer 34 and a gate junction dielectric spacer 36 proximal to the source-drain junction within silicon layer 24. The dielectric spacer is preferably formed from high-k dielectric, such as $TiO_2$ and $TiO_2$ and $Ta_2O_5$. A gate electrode 38 is preferably formed by filling the interior of dielectric spacer 34, 36, with metal that is subsequently polished. The remaining process steps in forming the ultra-thin body SOI MOSFET transistor 10 according to the present invention may then be performed utilizing conventional semiconductor processing techniques.

Accordingly, it will be seen that this invention provides a method for fabricating an ultra-thin body SOI MOSFET transistor with thick source-drain silicide regions and utilizing a high-k dielectric. Fabrication incorporates a gate-last process wherein the gate dielectric and metallization are formed pursuant to high temperature processing steps, such as silicide formation, to prevent metal diffusion into the silicon layer. It will be appreciated that the described method steps were provided by way of example, and that variations may be incorporated by one of ordinary skill without departing from the teachings of the invention. Furthermore, it will be appreciated that the specification describes an embodiment of the method for a specific process geometry and structure, however, the invention may be generally practiced for MOSFET devices of various configurations, processing practices, and processing geometries.

Although the description above contains many specificities, these should not be construed as limiting the scope of the invention but as merely providing illustrations of some of the presently preferred embodiments of this invention. Thus the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A method of incorporating a high-k dielectric gate insulator after silicide formation within a MOSFET transistor fabrication process on an SOI wafer that provides extended silicide depth, comprising:

forming a silicon-insulator stack wherein a segment from a deposited layer of insulator is positioned over a segment of silicon from the SOI wafer;

forming a second silicon layer from amorphous silicon (a-Si), wherein the second silicon layer has a planar upper surface which does not cover the segment of insulation;

implanting source-drain dopants beneath the segment of insulation;

annealing the substrate;

forming silicide on the upper portion of the second silicon layer;

removing of the segment of insulation to create a gate cavity;

forming a gate stack within the gate cavity, having a gate electrode insulated from the substrate by a high-k dielectric whereupon the remainder of the MOSFET transistor may be fabricated utilizing conventional process steps.

2. A method as recited in claim 1, wherein the process of forming a silicon-insulator stack, comprising:
   depositing a layer of insulator over the silicon layer of the SOI wafer;
   applying a photoresist pattern; and
   etching the combination of insulator layer and silicon layer.

3. A method as recited in claim 1, wherein the insulator segment comprises silicon nitride ($Si_3N_4$).

4. A method as recited in claim 1, wherein the height of the silicon-insulator stack is configured for a height of from 800 Angstroms to 1500 Angstroms.

5. A method as recited in claim 1, wherein annealing is performed at a low temperature of from 500° C. to 600° C.

6. A method of fabricating a MOSFET transistor on an SOI wafer having extended source-drain silicide and a gate with high-k insulation which is created subsequent to source-drain silicide formation, comprising:
   depositing a layer of insulator over the silicon on a second silicon layer of SOI wafer;
   selective etching of the insulator layer and underlying silicon layer such that a silicon-insulator stack is created having a segment of insulation attached above a segment of silicon;
   depositing a second layer of amorphous silicon (a-Si) over the silicon-insulator stack;
   removing upper portions of the amorphous silicon (a-Si) to expose the segment of insulation;
   implanting source-drain dopants beneath the segment of insulation;
   annealing the substrate to recrystallize the silicon and to activate dopants;
   forming silicide within the upper portion of the remaining lower portion of the recrystallized silicon layer (a-Si);
   removing of the segment of insulation to create a gate cavity;
   depositing high-k dielectric insulation within the interior of the gate cavity; and
   forming a gate electrode, whereupon the remaining fabrication steps may be performed according to conventional MOSFET device fabrication methods.

7. A method as recited in claim 6, wherein the depth of the deposited amorphous silicon (a-Si) exceeds the height of the gate stack upon which it is deposited.

8. A method as recited in claim 6, wherein the height of the silicon-insulator stack is configured for a height of from 800 Angstroms to 1500 Angstroms.

9. A method as recited in claim 6, wherein the amorphous silicon layer is deposited to a thickness of from 3000 Angstroms to 6000 Angstroms.

10. A method as recited in claim 6, wherein the upper portion of the silicon layer is removed within a chemical-mechanical etch process wherein the segment of insulation is utilized as the polishing stopper.

11. A method as recited in claim 6, wherein annealing is performed at a low temperature of from 500° C. to 600° C.

12. A method of fabricating ultra-thin body MOSFET transistor on an SOI wafer with a gate-last process, comprising:
   patterning dummy gate stacks on an SOI wafer that have a segment of deposited insulation stacked over a segment of silicon from the SOI wafer;
   forming a silicon layer on the SOI wafer;
   implanting a source drain junction beneath the segment of insulation;
   annealing the wafer;
   forming silicide on the silicon layer;
   removing the segment of insulation to create a gate cavity; and
   forming an insulated gate within the gate cavity, followed by conventional processing to complete the MOSFET device wherein the insulated gate is formed with a gate electrode which is insulated from the wafer by a high-k dielectric.

13. A method as recited in claim 12, wherein during formation, the amorphous silicon layer is undoped.

14. A method as recited in claim 12, wherein the dummy gate stack has a height of from 800 Angstroms to 1500 Angstroms.

15. A method as recited in claim 12, wherein the gate length is less than 35 nanometers.

16. A method as recited in claim 12, wherein the high-k dielectric is selected from within the group of high-k dielectrics consisting of $TiO_2$ and $TiO_2O_5$.

* * * * *

UNITED STATES PATENT AND TRADEMARK OFFICE
CERTIFICATE OF CORRECTION

PATENT NO.    : 6,551,886 B1
DATED         : April 22, 2003
INVENTOR(S)   : Bin Yu It is certified that error appears in the above-identified patent and that said Letters Patent is hereby corrected as shown below:

<u>Column 3,</u>
Line 34, after "6000" add -- Angstroms; --;
Line 61, after "TiO$_2$" delete "TiO$_2$ and";

<u>Column 6,</u>
Line 44, delete "TiO$_2$O$_5$" and replace with -- Ta$_2$O$_5$ --.

Signed and Sealed this

Nineteenth Day of August, 2003

JAMES E. ROGAN
*Director of the United States Patent and Trademark Office*